United States Patent [19]
Wakamatsu

[11] Patent Number: 5,463,323
[45] Date of Patent: Oct. 31, 1995

[54] IMPEDANCE METER

[75] Inventor: Hideki Wakamatsu, Hyogo, Japan

[73] Assignee: Hewlett-Packard Company, Palo Alto, Calif.

[21] Appl. No.: 333,784

[22] Filed: Nov. 3, 1994

[30] Foreign Application Priority Data

Dec. 28, 1993 [JP] Japan ................... 5-352012

[51] Int. Cl.⁶ .................................................. G01R 27/00
[52] U.S. Cl. .......................... 324/611; 324/642; 324/649; 324/650; 324/715; 324/688
[58] Field of Search .................................. 324/611, 642, 324/649, 650, 715, 688

[56] References Cited

U.S. PATENT DOCUMENTS

| 5,086,278 | 2/1992 | Wakamatsu | 324/650 |
| 5,345,182 | 9/1994 | Wakamatsu | 324/649 |

FOREIGN PATENT DOCUMENTS

| 0150336A3 | 8/1985 | European Pat. Off. | G01R 27/06 |
| 0349168A2 | 1/1990 | European Pat. Off. | G01R 27/26 |
| 2261075 | 10/1992 | United Kingdom | G01R 27/00 |

Primary Examiner—Kenneth A. Wieder
Assistant Examiner—Jose M. Solis

[57] ABSTRACT

An impedance meter is not adversely affected by errors originating from changes in characteristics of measurement cables under measurement conditions such as in an environmental test wherein an element to be measured is remote and high and wide measurement frequencies are used. The voltage and the current of an element to be measured are measured to obtain its impedance and the like. A circuit configuration is provided wherein a cable for supplying a measurement signal to the element to be measured and for detecting the current flowing through the element to be measured is a triaxial cable and a cable for detecting the voltage is a coaxial cable, and wherein impedance matching is performed at the ends of the triaxial cable and the coaxial cable on the side of a measuring device and a balun is provided to float an ammeter on a coaxial cable connecting the ammeter-side end of the triaxial cable to the ammeter.

5 Claims, 6 Drawing Sheets

IMPEDANCE METER

FIELD OF THE INVENTION

The present invention relates to the field of remote measurement of circuit constants such as impedance and characteristics of materials and, more particularly, to measurement of the same at high frequencies and over wide bands. In this specification, it is assumed that the term "impedance" implies values of resistance, capacitance, inductance and the like.

Impedance meters for high and wide frequency bands must be capable of accurately measuring a wide range of impedance and permit remote measurement. The present invention addresses a method for achieving these requirements. A method of achieving these requirements has been proposed in Japanese Patent Application No. 3-313898 and the present specification addresses improvements added thereto with regard to a capability for remote measurement.

BACKGROUND OF THE INVENTION

In remote measurement, the main body of a measuring apparatus and an element to be measured are normally connected by cables, which can be a source of errors. FIG. 9 shows an example of a test for temperature characteristics of an element to be measured. An element to be measured 97 is placed in a chamber 92. The main body 91 of a measuring apparatus (outside the chamber) and the element to be measured are connected by a single heat resisting cable 93.

In the measurement, a raw measured value from the measuring apparatus is a value obtained from the element to be measured and includes series inductance L and parallel capacitance C of the cable. This raw measured value is corrected by eliminating the series inductance and the parallel capacitance of the cable to obtain the desired impedance of the element to be measured. However, if the series inductance and the parallel capacitance of the cable vary due to temperature or mechanical stresses such as bending of the cable, an error can occur in the impedance value of the element to be measured.

A simplified example will be presented in the case of a measurement performed on a capacitor having high impedance wherein the series inductance of the cable can be neglected. As shown in FIG. 10, it is assumed that the cable, an element to be measured A and an element to be measured B have respective capacitances (Cx) of 100 pF, 1000 pF, and 10 pF. The measuring apparatus measures 1100 pF and 110 pF from elements A and B, respectively, and performs correction by subtracting the capacitance of 100 pF of the cable therefrom to obtain correct values of 1000 pF and 10 pF. Assume that the capacitance of the cable is increased by 1%, i.e., 1 pf from the value which has been measured in advance, as a result of a change in temperature, bending of the cable and the like. Then, the measured values which have been corrected will be 1001 pF for element A and 11 pF for element B. The error is only 0.1% for the former but is as large as 10% for the latter. In other words, the greater the impedance (the smaller the capacitance) of an element to be measured, the more serious the effect of the parallel capacitance of the cable on measurement errors.

Similarly, the smaller the impedance of an element to be measured, the more serious the effect of the series inductance of the cable. This is summarized in FIG. 11 which shows the tendency towards error relative to the impedance Zx of an element to be measured.

There is a method for preventing reduction in the accuracy of impedance measurement in low and high ranges due to changes in the characteristics of a cable, wherein the voltage across an element to be measured and the current flowing therethrough are separately measured using two or more cables and are compared to obtain the impedance of the element to be measured. The four terminal pair measurement is typical of this approach. The two-terminal-trio method (refer to Japanese Patent Application No. H03-274543) is suitable for high frequencies wherein grounding of an element to be measured is possible. In either method, the overall effect is smaller, the higher the frequency. In addition, a negative feedback amplifier for maintaining the current or voltage of an element to be measured at a certain value must be used in both of these methods. Such a negative feedback amplifier operating at high frequencies is complicated and is difficult to implement in practice.

Under such circumstances, the volt-ammeter method (hereinafter referred to as V-I method), wherein no negative feedback amplifier is used, has been devised and put in use to cover high frequency bands ranging from 1 MHz to 1 GHz. One version of this approach is to use a current transformer. In another approach, the current transformer is replaced by a balun to deal with wider bands, with impedance matching taken into consideration. Such versions of the V-I method, however, use a transformer or balun in the vicinity of a measurement terminal and, therefore, are not appropriate for the purpose of evaluating temperature characteristics of an element to be measured. The reason for this is that since such a portion is left in a chamber, the measuring apparatus is adversely affected by temperature. Usage is absolutely limited by the Curie-point of magnetic elements when the temperature slightly exceeds 100° C.

Object of the Invention

It is an object of the present invention to provide a means for realizing an impedance meter having a heat resisting measurement terminal portion which is capable of accurately measuring wide impedance ranges in high frequency bands and measuring characteristics of a grounded element.

SUMMARY OF THE INVENTION

An embodiment of the present invention has a circuit configuration in accordance with the V-I method which is not adversely affected by changes in the characteristics of cables and which has no circuit component such as a balun in the vicinity of a measurement terminal. The circuit configuration includes triaxial cables and coaxial cables used as measurement cables; the cables are matched to the respective characteristic impedances at the side of the measuring apparatus; and a balun is disposed in the triaxial cables in a position close to the measuring apparatus.

DESCRIPTION OF THE REFERENCE NUMBERS

Figure 1:
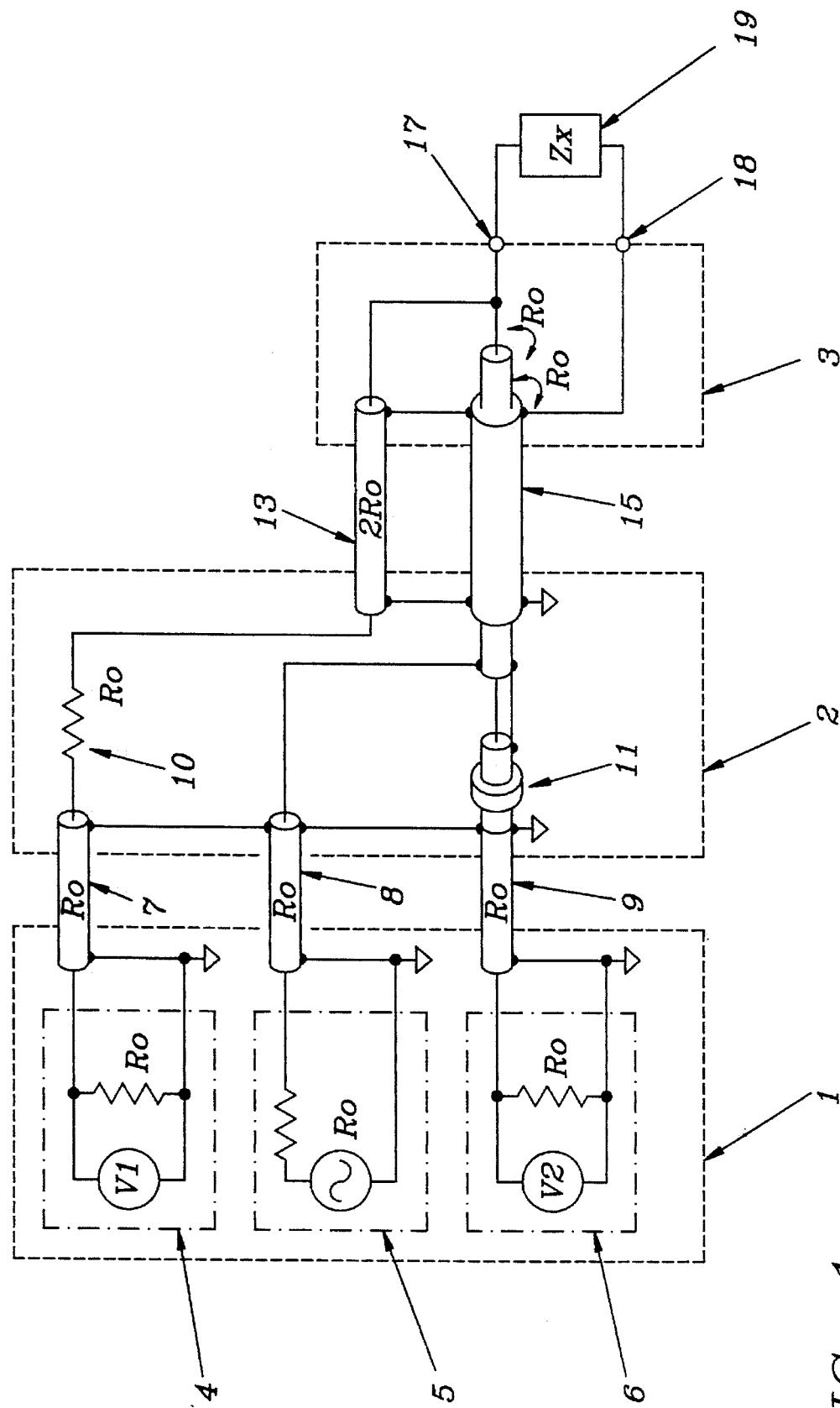
FIG. 1 shows a first embodiment of the present invention.

1: main body of measuring apparatus
2: interface portion
3: measurement terminal portion
4: voltmeter for voltage measurement
5: signal source
6: voltmeter for current measurement
7: coaxial cable having characteristic impedance of Ro
8: coaxial cable having characteristic impedance of Ro
9: coaxial cable having characteristic impedance of Ro
10: terminating resistor
11: balun
12: terminating resistor
13: coaxial cable having characteristic impedance of 2Ro
14: coaxial cable having characteristic impedance of Ro
15: triaxial cable (characteristic impedance is Ro for both inner and outer coaxial cables)
16: triaxial cable (characteristic impedance is Ro/2 for inner coaxial cable and Ro for outer coaxial cable)
17: measurement terminal
18: measurement terminal
19: element to be measured
20: virtual conductor for intermediate conductor of triaxial cable
21: virtual conductor for intermediate conductor of triaxial cable
91: impedance measuring device
92: chamber
93: heat resisting extension cable
94: signal source
95: ammeter
96: voltmeter
L: series inductance of cable
C: parallel capacitance of cable
Zx: impedance of an element to be measured
Cx: capacitance of an element to be measured

DETAILED DESCRIPTION OF THE INVENTION

Figure 2:
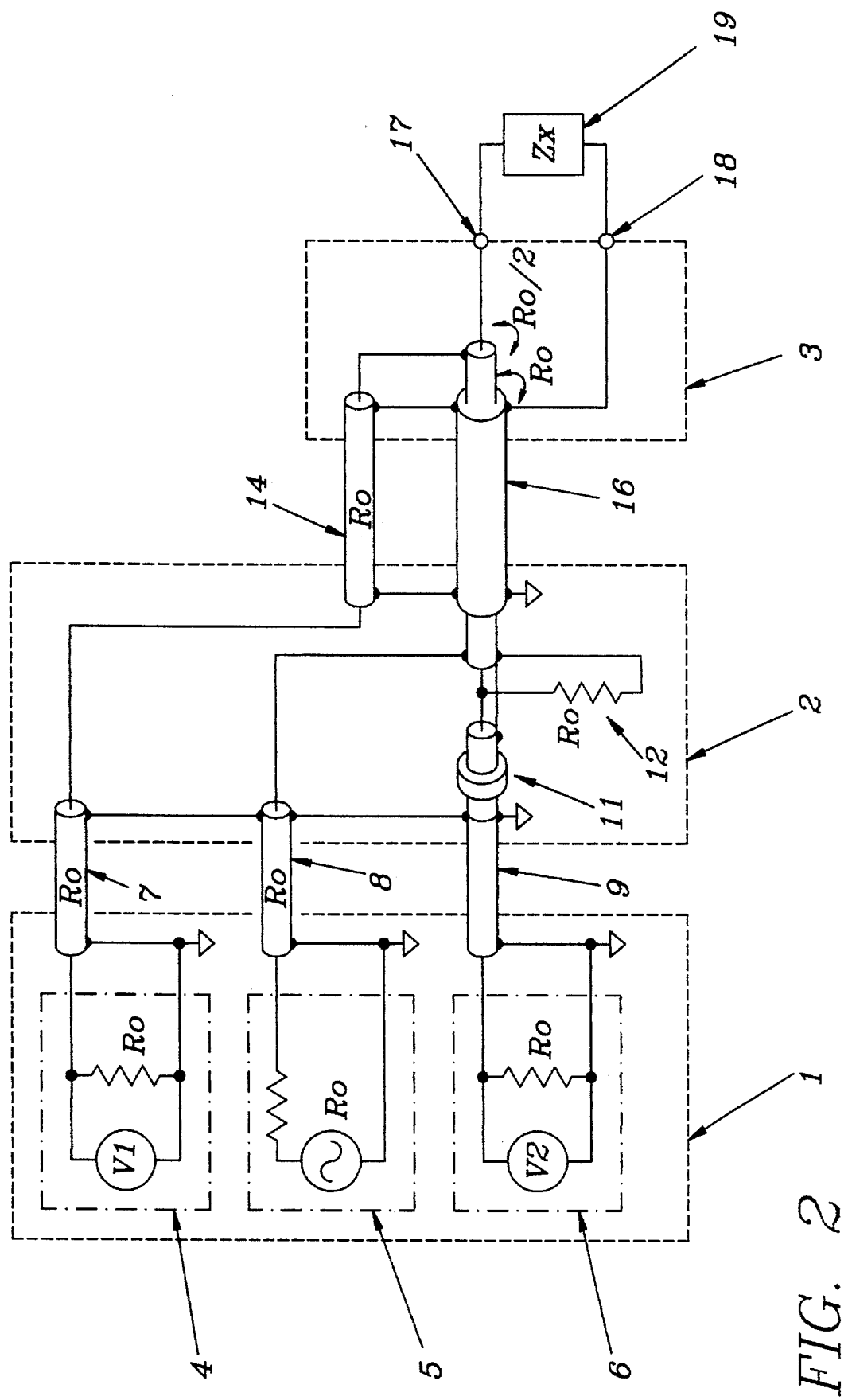
FIG. 2 shows a second a second embodiment of the present invention.

FIG. 1 shows a first embodiment of the present invention, and FIG. 2 shows a second embodiment. Components having like functions are indicated by like reference numbers. The method shown in FIG. 1 is suitable for measurement of low impedances and the method in FIG. 2 is suitable for measurement of high impedances.

As shown in FIG. 1 and FIG. 2, the measuring apparatus of the present invention comprises a main body 1 of the measuring apparatus, an interface portion 2, a measurement terminal portion 3, and cables for connecting them. These embodiments differ from each other in the presence or absence of resistors 10 and 12, the characteristic impedances of cables 13 and 14 and cables 15 and 16, and the connection points between the cables 13 and 15 and between the cables 14 and 16. Therefore, FIG. 1 will be fully described and FIG. 2 will be described only where differences exist.

An element to be measured 19 is placed in a position which is physically apart from the main body 1 of the measuring apparatus and is connected to measurement terminals 17 and 18 at the measurement terminal portion 3.

Cables 7, 8 and 9, connecting the main body 1 of the measuring apparatus and the interface portion 2, are normal coaxial cables whose characteristic impedance is Ro. A signal source 5 in the main body of the measuring apparatus has an output impedance of Ro and is impedance-matched to the cable 8. Voltmeters 4 and 6 are high frequency complex (or vector) voltmeters having an input impedance of Ro and are respectively impedance-matched to the cables 7 and 9. The voltmeters 4 and 6 measure the voltage and current, respectively, of the element to be measured, and the ratio between the values thus measured is calculated to obtain the impedance value.

The measurement terminal portion 3 and the interface portion 2 are connected by the cables 13 and 15. The characteristic impedance of cable 13 is the sum of the characteristic impedance of cable 7 and resistor 10, i.e., 2Ro. 15 designates a triaxial cable having a structure wherein an intermediate conductor is provided between a central conductor and an outer conductor of a coaxial cable. Characteristic impedance is Ro for both a coaxial cable consisting of the central conductor and the intermediate conductor and a coaxial cable consisting of the intermediate conductor and the outer conductor. Therefore, the ratio of the characteristic impedance of the coaxial cable 13 to that of the coaxial cable inside the cable 15 is 2 to 1.

Although voltmeter 6 for measuring current is grounded, the current flowing through the element to be measured can be measured in a floating state by installing a balun 11 on the cable 9.

In FIG. 2, the characteristic impedance of cable 14 is Ro, which is equal to that of cable 7. The triaxial cable 16 has an apparent structure which is the same as that indicated by 15 in FIG. 1. However, the characteristic impedance of the coaxial cable consisting of the central conductor and the intermediate conductor is Ro/2 which is equal to the parallel resistance value of the characteristic impedance of the cable 9 and the resistor 12. The characteristic impedance of the coaxial cable consisting of the intermediate conductor and the outer conductor of the triaxial cable is Ro. Therefore, the ratio of the characteristic impedance of the coaxial cable 14 to that of the coaxial cable inside the cable 16 is 2 to 1.

An exemplary application of the present invention is measurement of the temperature characteristics of an element to be measured which is placed in a chamber. In this exemplary application, the measurement terminal portion 3 is placed in the chamber. This measurement terminal portion 3 does not include circuit elements such as a balun. The characteristics of cables 13 and 15 (FIG. 1) change under changes in temperature and mechanical stresses such as bending caused by the arrangement of the cables between the inside and outside of the chamber. However, there is no influence of the changes in the characteristics of the cables because the V-I method is employed.

As described above, the present invention is suitable for remote measurement such as tests of temperature characteristics, because the measurement terminal portion does not include circuit elements such as a balun and the V-I method employed is free from the effect of changes in characteristics of the cables.

Figure 3:
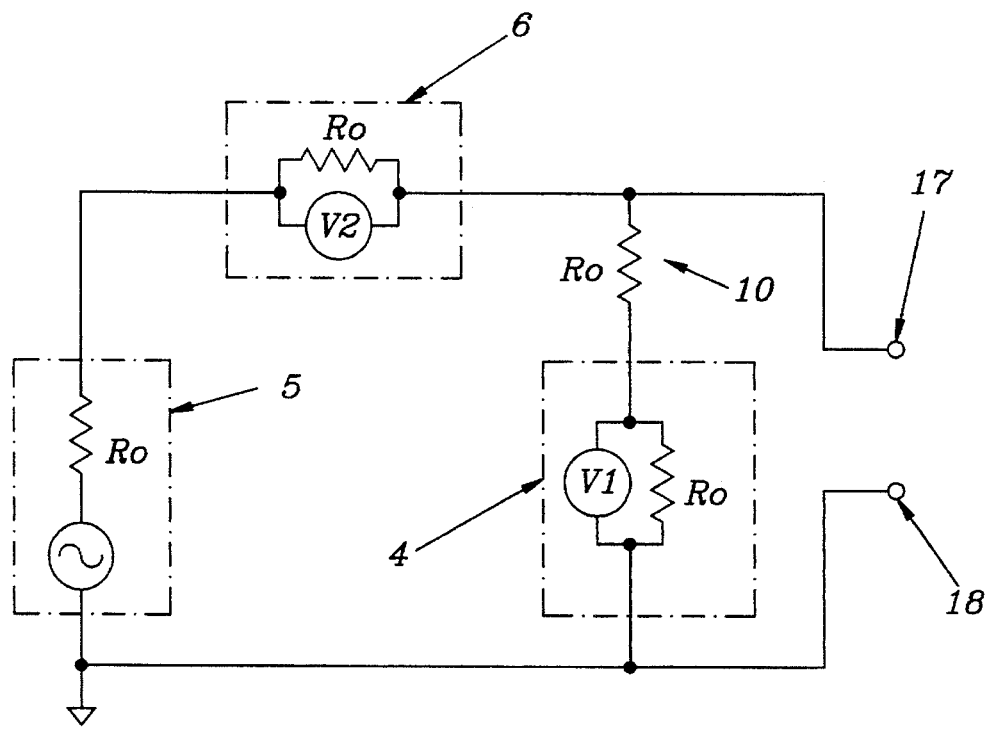
FIG. 3 is an equivalent circuit diagram illustrating the principle of the measurement in the first embodiment of the present invention.
Figure 4:
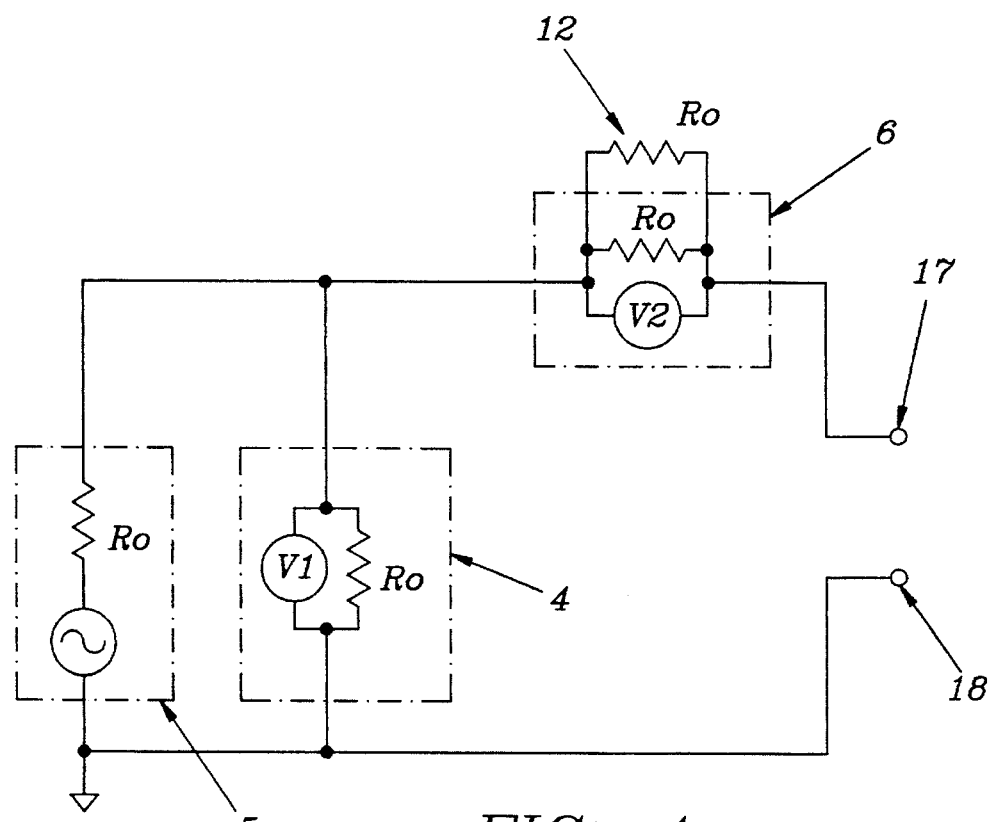
FIG. 4 is an equivalent circuit diagram illustrating the principle of the measurement in the second embodiment of the present invention.

The principles of measurement will now be described. FIG. 1 and FIG. 2 may be converted into equivalent circuits according to the V-I method which have lumped element circuits as shown in FIG. 3 and FIG. 4, respectively. Although changes in phases during signal transfer on the cables are neglected in these equivalent circuits, it creates no problem in describing the principles of operation. FIG. 3 shows a circuit which is appropriate for an element to be measured having a low impedance. Specifically, however low the impedance of the element to be measured, the voltage across the element is measured with high sensitivity by voltmeter 4 as proportionate to the impedance value. On the other hand, FIG. 4 shows a circuit which is appropriate for an element to be measured having a high impedance. Specifically, however high the impedance of the element to be measured, the current thereof is measured with high sensitivity by the voltmeter 6 as proportionate to the admittance value.

In FIG. 3, signal source 5 and voltmeter 6 for current measurement are connected in series and provide a resistance of 2Ro. In order to set the impedance of the measuring apparatus, as viewed from the element to be measured, at Ro, the resistor 10 is inserted in series with the voltmeter 4. In FIG. 4, resistor 10 is not provided because signal source 5 and voltmeter 4 are connected in parallel, and resistor 12 is connected to voltmeter 6 for current measurement in parallel to set the impedance of the measuring apparatus at Ro, as viewed from the element to be measured. The present embodiment is characterized in that the impedance of the measuring apparatus is Ro for both low and high impedances. In an environment where such a feature is not necessary, it is apparent that the resistors 10 and 12 (for impedance matching) can be eliminated and the characteristic impedance of the coaxial cables inside the cables 13 and 16 may be Ro.

Figure 5:
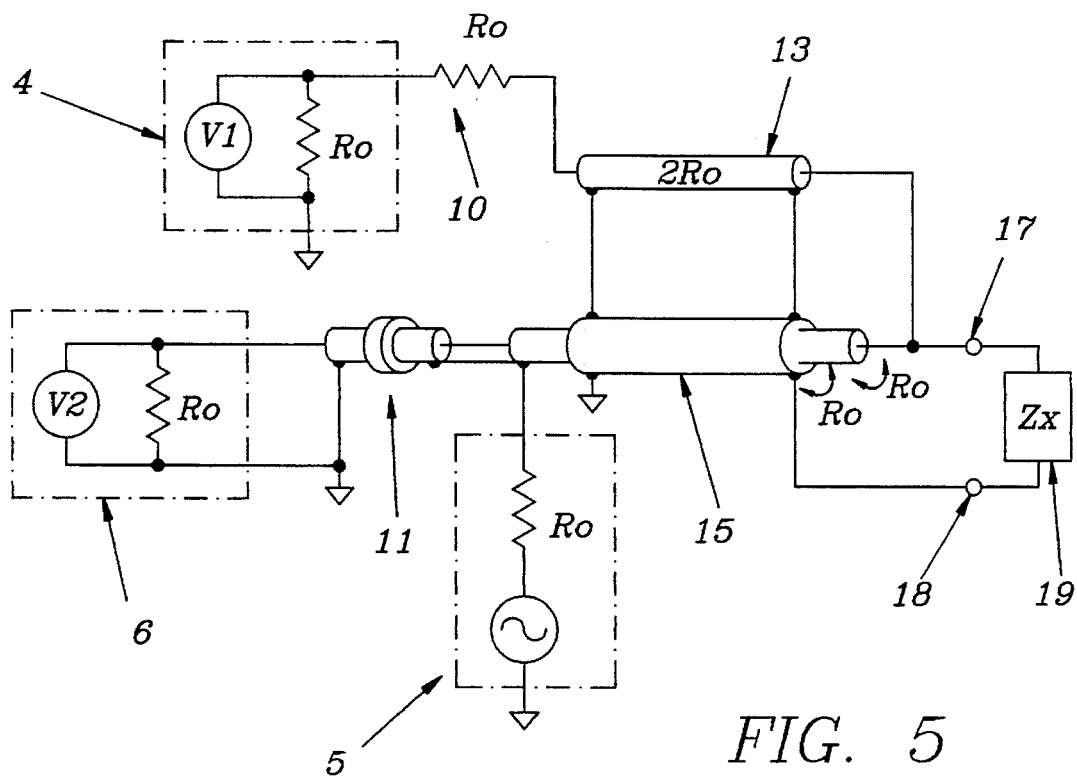
FIG. 5 is an equivalent circuit diagram obtained by converting FIG. 1.

The process of conversion from FIG. 1 to FIG. 3 will now be described. The input impedance and amplitude transfer characteristics of a cable which has been impedance-matched are the characteristic impedance of the cable and 1, respectively, regardless of the length of the cable. Therefore, the cables 7, 8, and 9 can be neglected and FIG. 1 can be converted to FIG. 5.

Figure 6:
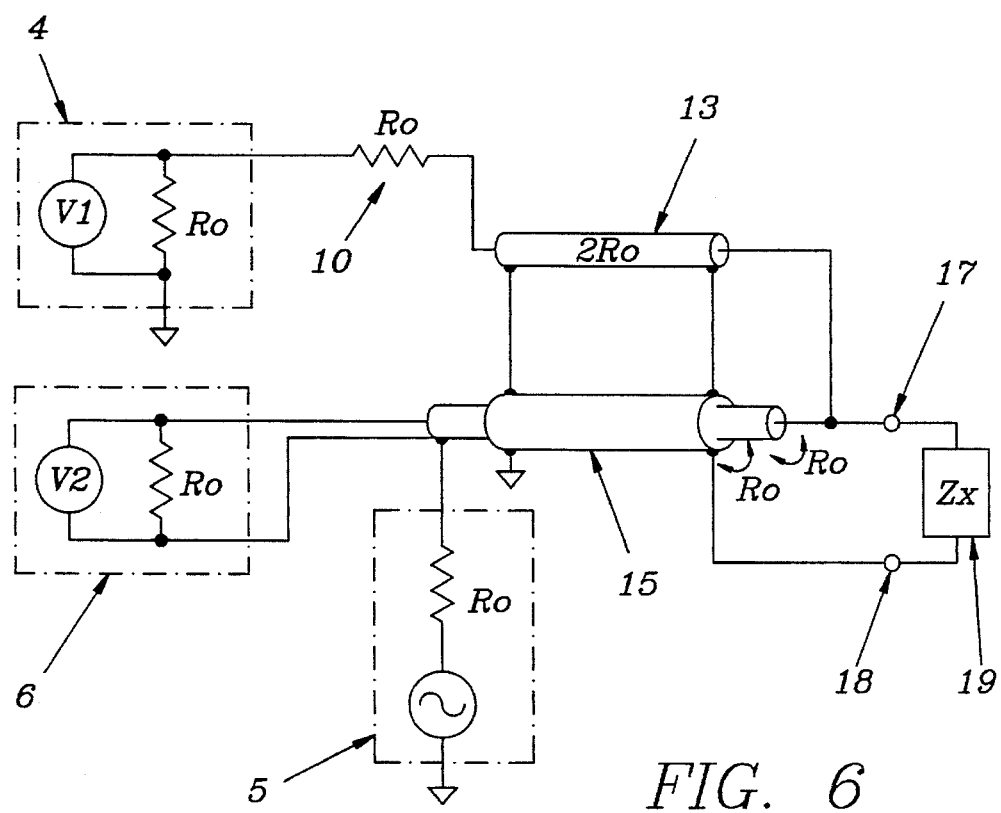
FIG. 6 is an equivalent circuit diagram obtained by converting FIG. 5.

The part of voltmeter 6 for current measurement can be converted as shown in FIG. 6, based on that fact that the input impedance and amplitude transfer characteristics of a cable which has been impedance-matched are the characteristic impedance of the cable and 1, respectively, regardless of the length of the cable, and based on the floating effect provided by the balun.

Figure 7:
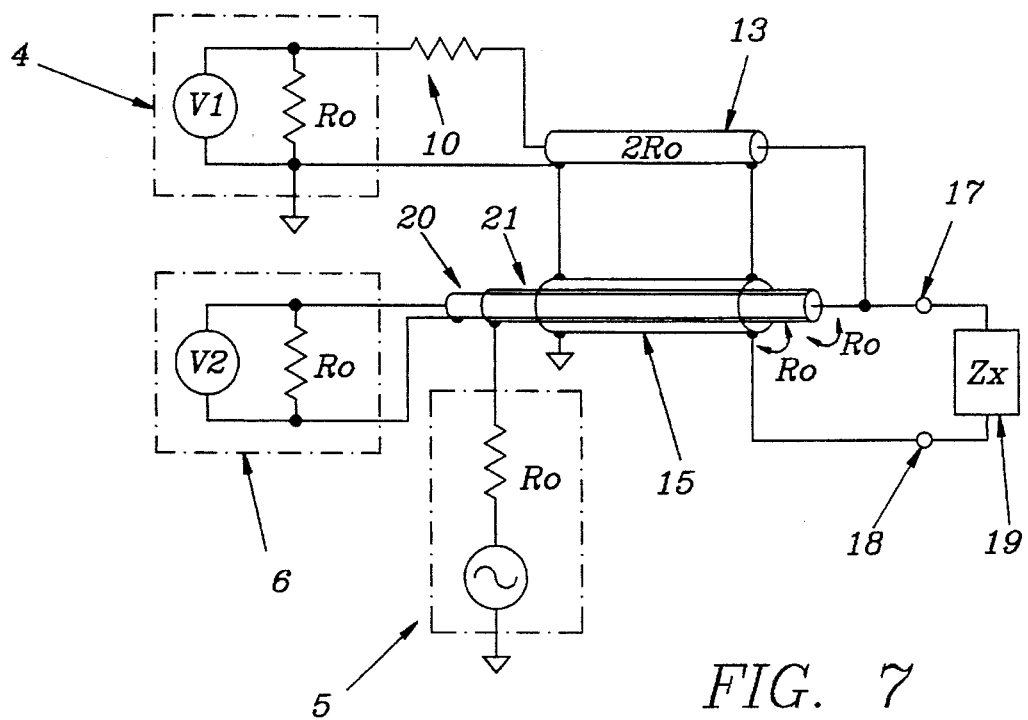
FIG. 7 is an equivalent circuit diagram obtained by converting FIG. 6.

As shown in FIG. 7, the intermediate conductor of the triaxial cable may be divided into two virtual conductors 20 and 21, and the triaxial cable may be constituted by a coaxial cable consisting of the central conductor and the virtual conductor 20 and a coaxial cable constituted by the virtual conductor 21 and the outer conductor.

The inner coaxial cable can be freely extended or shortened inside the cylindrical conductor 21 without interfering with a signal transmitted on the outer coaxial cable. Further, since the inner coaxial cable is matched to and terminated by the voltmeter 6 for current measurement, it can be freely extended or shortened without causing any change in the impedance and amplitude characteristics, as viewed from the other end. This is shortened to the extremity as shown in FIG. 8.

Figure 8:
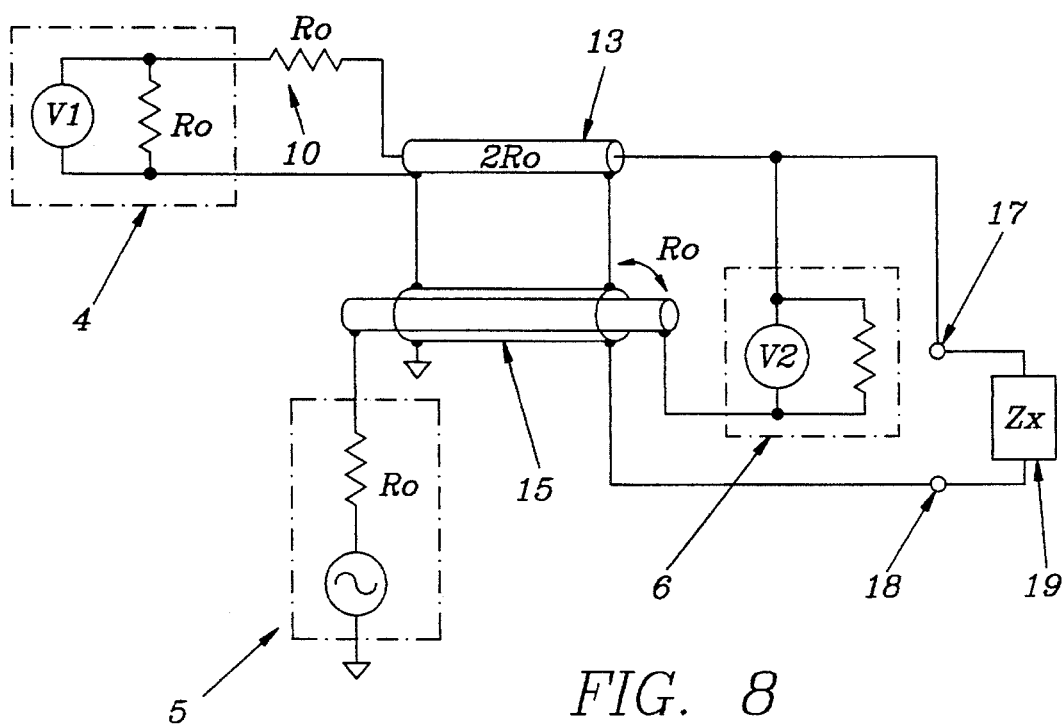
FIG. 8 is an equivalent circuit diagram obtained by converting FIG. 7.
Figure 9:
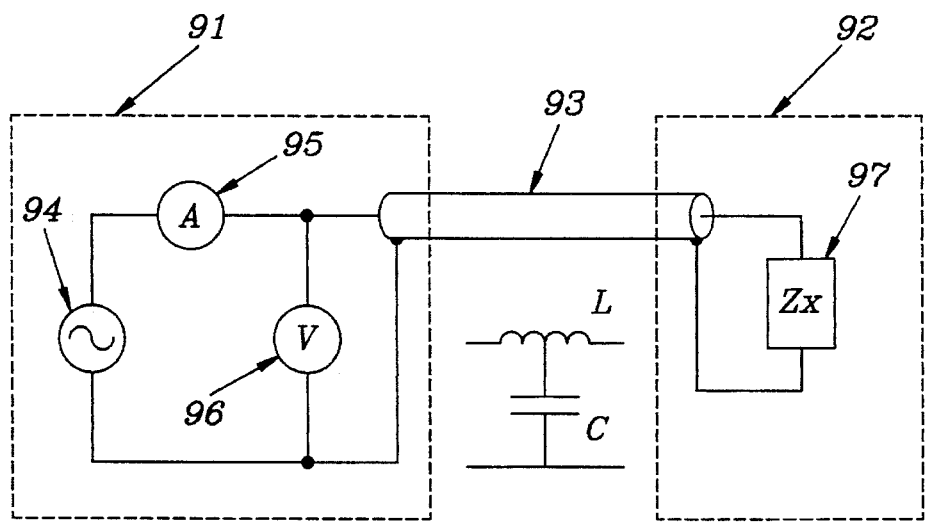
FIG. 9 shows an example of remote measurement using a single coaxial cable.
Figure 10:
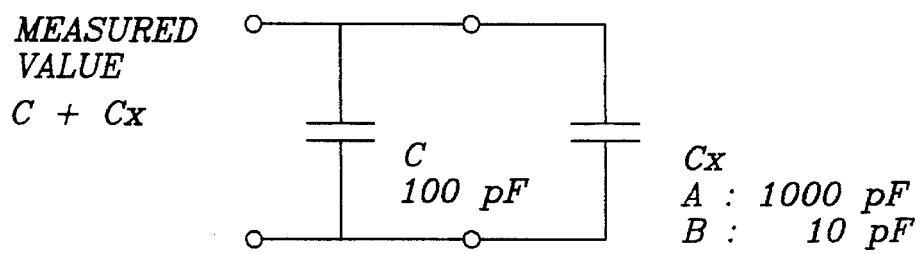
FIG. 10 shows a model illustrating the effect of the capacity of the cable in FIG. 9.
Figure 11:
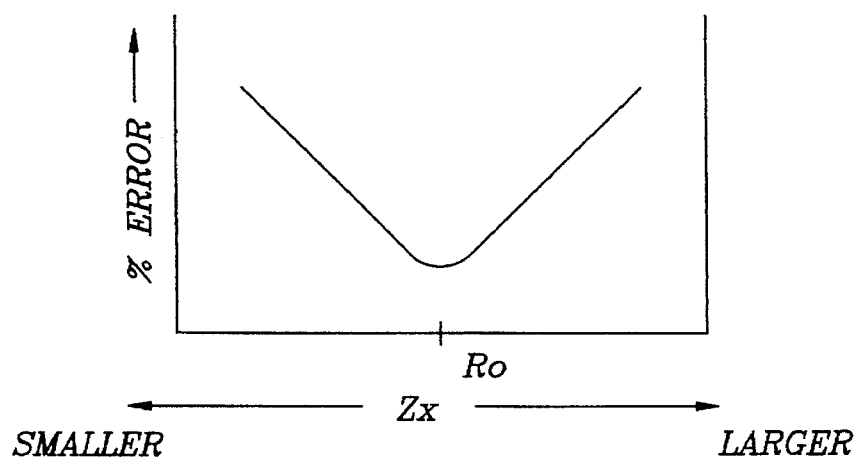
FIG. 11 shows the tendency towards errors in measurement resulting from changes in the characteristics of a coaxial cable.

In FIG. 8, since the left ends of cables 13 and 15 are impedance matched and terminated, the cables can be freely extended or shortened as in the previous case to the extremity as shown in FIG. 3.

FIG. 4 can be obtained from FIG. 2 through the same process.

As described above, in a cable which can be properly matched and terminated, the input impedance and amplitude transfer characteristics thereof do not change even if the length of the cable is changed. FIG. 1 and FIG. 2 are equivalent to FIG. 3 and FIG. 4, respectively, except for phases. It is apparent that characteristics that are purely resistive can be maintained and no variation occurs in the voltage at the measurement terminal or as a result of resonance of the cable, even if the cable is extended.

At high frequencies, grounded (unbalanced) measurement is advantageous in view of traceability, practicality and applicability. In this case, however, an ammeter which has a floating potential is indispensable for the V-I method. The present invention is characterized in that an ammeter which is floated by a balun is connected by a triaxial cable to a measurement terminal portion.

The characteristics of the present invention are, in summary, that extension of cables can be achieved without losing the characteristics of two basic circuits in accordance with the V-I method suitable for both high and low impedance. Since the measurement terminal portion does not include a transformer, a balun, a resistor and the like, heat resistivity depends on only the material of the cables. Therefore, if Teflon is used as the insulator for the cables, measurement at temperatures of up to 200° is possible.

The impedance of the measuring apparatus viewed from the measurement terminal can be pure resistance (e.g., 50 ohms). In addition, the circuit configuration which is impedance-matched as a whole provides flat frequency characteristics for the exciting voltage, measured voltage, and measured current of an element to be measured regardless of the lengths of the cables, eliminating restriction on the lengths of the cables.

These features make it possible to put the present invention in use at frequency bands from 1 MHz to 1 GHz or more

EFFECTS OF THE INVENTION

The present invention allows remote measurement with good heat resistivity and frequency characteristics and a wide impedance measurement range in high frequencies, and is advantageous especially in applications in the field of temperature-characteristics evaluation of high frequency components and materials.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. An impedance meter for measuring current and voltage at a device under test (DUT), comprising:

- a triaxial cable having first and second ends, a center conductor, an intermediate conductive sheath insulated from and positioned about said center conductor and an outer conductive sheath insulated from and positioned about said intermediate conductive sheath;
- conductive means for connecting said DUT at said second end of said triaxial cable between said center conductor and said outer conductive sheath;
- a signal source connected between said intermediate conductive sheath and said outer conductive sheath at said first end of said triaxial cable, for introducing a test signal into said DUT;
- current measurement means coupled between said center conductor and said intermediate conductive sheath at said first end of said triaxial cable, for measuring current flow therethrough;
- a coaxial cable having first and second ends, an inner conductor and an outer conductive sheath, said inner conductor and outer conductive sheath at said second end connected to said center conductor and outer conductive sheath of said triaxial cable, respectively; and
- voltage measurement means coupled between said inner conductor and outer conductive sheath at said first end of said coaxial cable for measuring voltage across said DUT upon application of a signal thereto by said signal source.

2. The impedance meter as recited in claim 1 wherein said coaxial cable and triaxial cable are impedance matched at said second ends.

3. The impedance meter as recited in claim 1 wherein said coaxial cable exhibits a characteristic impedance that is twice as large as a characteristic impedance exhibited between said center conductor and said intermediate conductive sheath of said triaxial cable.

4. The impedance meter as recited in claim 1 wherein said current measurement means is coupled to said first end of said triaxial cable via a balun.

5. The impedance meter as recited in claim 1 wherein said current measuring means, voltage measuring means and signal source each exhibit output impedances that match characteristic impedances of connected coaxial and triaxial cables.

* * * * *